United States Patent [19]

Berkman et al.

[11] B 3,989,210
[45] Nov. 2, 1976

[54] CABLE CLAMP AND STRAIN RELIEF DEVICE

[75] Inventors: John Worrall Berkman, Thousand Oaks, Calif.; Frederic Cyrus Pexton, Rochester, Minn.

[73] Assignee: International Business Machines Corporation, Armonk, N.Y.

[22] Filed: Aug. 5, 1974

[21] Appl. No.: 494,806

[44] Published under the second Trial Voluntary Protest Program on February 3, 1976 as document No. B 494,806.

[52] U.S. Cl. ................................ 248/73; 248/500; 24/73 SA
[51] Int. Cl.² ........................................... F16L 3/08
[58] Field of Search............ 248/71, 73, 74 A, 54 R, 248/68 R, 361, 500, 508, 509, 510; 24/243 P, 67.11, 73 SA, 73 B, 73 MF, 81, 73 TF, 73 SM, 115 G; 339/125, 17 F, 103; 174/40 CC

[56] References Cited
UNITED STATES PATENTS

| | | | |
|---|---|---|---|
| 2,127,072 | 8/1938 | Tinnerman | 24/259 TF |
| 2,201,335 | 5/1940 | Cotter | 24/73 MF |
| 2,819,858 | 1/1958 | Mittendorf | 248/54 R |
| 2,855,648 | 10/1958 | Jansson | 248/68 R |
| 2,893,671 | 7/1959 | Flora et al. | 248/73 |
| 3,444,596 | 5/1969 | Soltysik | 24/73 SA |

FOREIGN PATENTS OR APPLICATIONS

| | | | |
|---|---|---|---|
| 167,302 | 3/1956 | Australia | 24/73 SM |
| 1,542,352 | 9/1968 | France | 24/73 SA |
| 1,114,461 | 5/1968 | United Kingdom | 339/17 F |
| 894,142 | 4/1962 | United Kingdom | 248/361 |
| 667,545 | 3/1952 | United Kingdom | 248/73 |

Primary Examiner—William H. Schultz
Assistant Examiner—Robert A. Hafer
Attorney, Agent, or Firm—Robert W. Lahtinen

[57] ABSTRACT

A cable clamp and strain relief device is formed as a single piece from sheet material with a turned spring arm which provides a cable retaining, strain relieving function and a pair of depending leg members formed by flanging material at each transverse margin. The leg members each terminate in a turned distal end and are received in a pair of apertures in a cooperating plate. The terminal part of the distal end has a central tab with shoulders at each side such that normally the central tab springs out beneath the lower surface upon insertion through the apertures, but when insertion is restricted the shoulders may engage the plate lower surface adjoining the aperture to retain the clamp.

3 Claims, 5 Drawing Figures

CABLE CLAMP AND STRAIN RELIEF DEVICE

BACKGROUND OF THE INVENTION

The present invention is directed to clamping devices and more particularly to a simplified structure for clamping and providing strain relief for a varying number of cable elements.

A cable clamping device should have a simple structure, devoid of critical dimensions while being easy to assemble and providing a positive cable holding capability. In addition, it is desirable to use a clamp where a single design and size can provide for all or a wide range of applications.

In the structure of the present invention a clamp member is formed from a single blank of resilient sheet material such as steel with the retaining legs and cable engaging spring clamp member formed from the blank. The only cooperating structure required for use of the clamp is a pair of apertures in the plate member that forms the surface against which the cable is to be retained. The assembly of the clamp member to the plate to hold captive and retain a cable straddled by the legs requires only that the depending leg members be inserted into the cooperating pair of plate apertures until turned leg member distal ends clear and spring behind the opposite plate surface to effect positive retention. The illustrated design, particularly adaptable to holding flat cable, will clamp a single cable or a stack of several cables and is also adaptable to varying thicknesses of cooperating apertured plates. Accordingly, the same size and dimension clamp may be used not only with various numbers of cables, but also with various thickness panels enabling the clamping to relatively thin sheet metal surfaces or relatively thick frame elements. In addition, where the capacity of the clamp is moderately exceeded retention is effected by shoulders on the clamp leg elements displaced away from the terminal ends.

It is an object of this invention to provide a cable clamp and strain relief that is simple in design, easily installed and requires minimal preparation of the cooperating member. It is a further object of the invention to provide such a clamp that is usable in a single size to clamp a varying number of cables and cooperable with cooperating apertured plate members of varying thickness. The foregoing and other objects, features and advantages of the invention will be apparent from the following more particular description of a preferred embodiment of the invention, as illustrated in the accompanying drawings.

DETAILED DESCRIPTION

Figure 1:
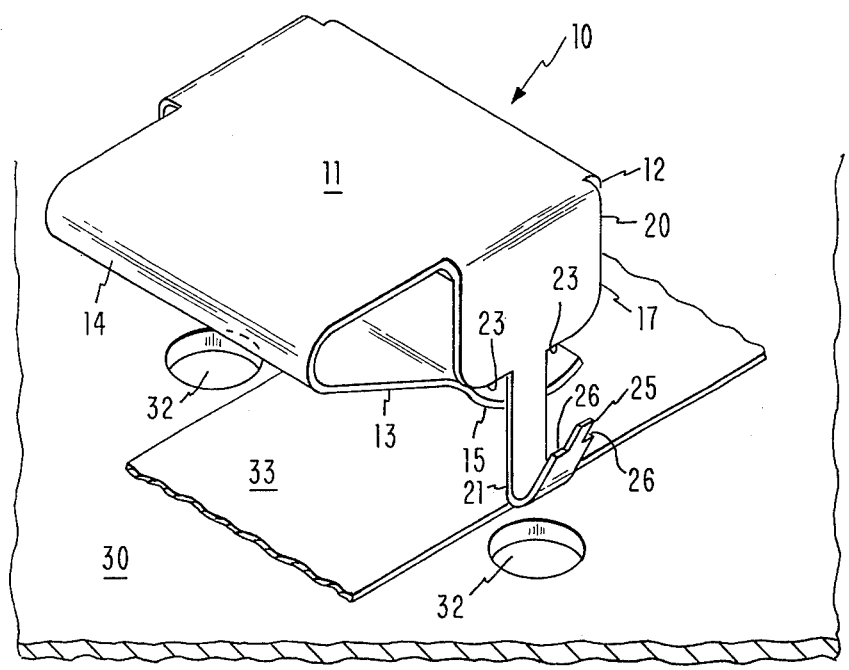
FIG. 1 shows an isometric view of the clamp and strain relief device of the present invention in exploded relation to an apertured plate member portion and a cable portion be clamped therebetween.
Figure 2:
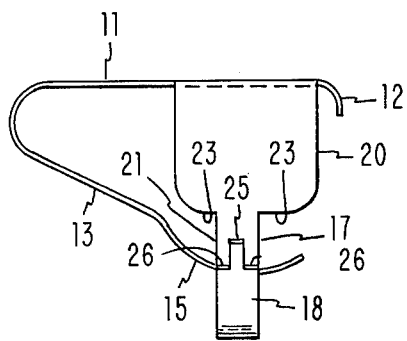
FIG. 2 is a side elevation of the clamp of FIG. 1.
Figure 3:
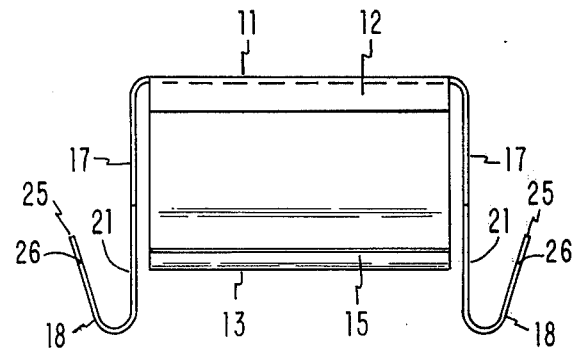
FIG. 3 is an elevation of the clamp of FIG. 1 as seen from the right side of the view of FIG. 2.

As seen in FIGS. 1, 2 and 3 a clamp and strain relief device 10 is formed of a single formed blank of resilient material such as sheet steel. A generally planar body portion 11 is turned at the front longitudinal edge 12 to enhance rigidity. The rear longitudinal portion is turned under to form a spring arm 13 underlying body portion 11. The cylindrical surface 14 at the junction of the body portion 11 and spring arm 13 is of sufficiently great radius to permit the material to remain within the elastic limit when the spring arm is depressed into contact with the body portion. The spring arm 13 has a convex surface 15 adjoining marginal edge of the distal end.

Depending from each transverse marginal edge of the body portion is a leg member 17 which has a turned distal end 18. The depending leg member 17 has an initial enlarged portion 20 from which extends a reduced constant width portion 21 with shoulders 23 at either side. The distal end of the leg member terminates in a tab 25 with shoulders 26 at opposite sides.

Figure 4:
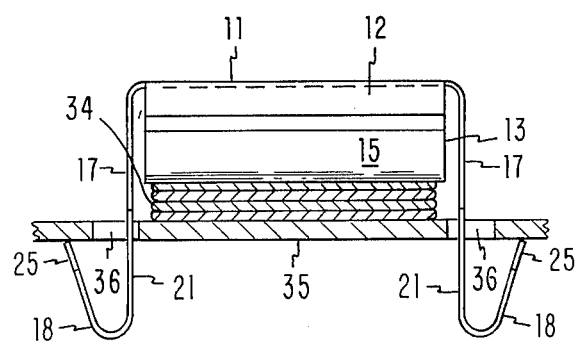
FIG. 4 is a view of the clamp similar to FIG. 3, but showing the same assembled to a cooperating apertured plate (illustrated in section) and confining a cable stack in the normal assembled condition.
Figure 5:
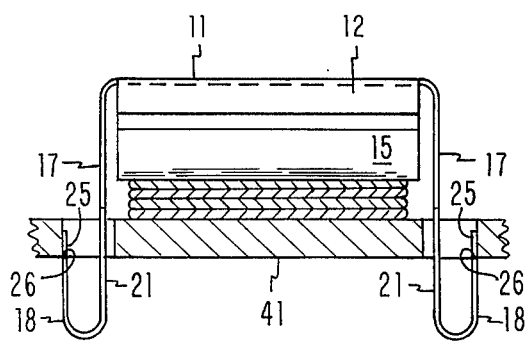
FIG. 5 is similar to FIG. 4, but illustrating an alternate assembled condition wherein the combined plate and cable stack thickness prevented insertion of the terminal ends of the clamp leg members beyond the plate lower surface.

The clamp 10 as shown is particularly adapted for use with flat cables which may be retained either singly or stacked in multiples. As seen in FIG. 1, clamp 10 cooperates with a plate member 30 having a pair of spaced apertures 32 to retain a cable 33 straddled by the depending legs. The normal clamping orientation is shown in FIG. 4 where a series of stacked cables 34 is retained between plate 35 and spring arm 13. When the depending legs 17 are inserted through apertures 36 the distal ends 18 spring back or restore to a position underlying the lower surface 37 of the cooperating plate member. In this position the distal ends 18 positively lock the clamp with respect to the plate member and are not subject to disengagement as a result of vibration. When because of the thickness of the cooperating plate the number of cables retained or both it is not possible to depress the clamp against the biased spring arm 13 sufficiently to allow the tabs 25 to clear beyond the lower surface 41 of plate 42, but it is possible to have the shoulders 26 adjoining the tabs 25 extend beyond surface 41, then such shoulders 26 will spring into an engaging position with surface 41 to retain the clamp. This disposition is illustrated in FIG. 5.

In practice, the shoulders 23 on the depending leg members 17 limit insertion into the cooperating apertures 32. In one application as illustrated, the width of the depending leg members between the shoulders 23 and shoulders 26 is about two-thirds the diameter of the cooperating apertures 32 in plate member 30 and the turned distal end 18 projects away from the depending portion 21 a distance approximately equivalent to the diameter of apertures. The clamp design, as shown, can retain one or several flat cables depending upon the cable thickness. Grounding cables have the smallest thickness dimension, while insulated cables of varying thickness may be used. The illustrated design can clamp as many as eight grounding cables or as many as seven of a more commonly used multiple conductor signal cable. The spring arm 13 maintains the correct retaining pressure for any number of retained cables, from a single cable to the capacity of the clamp. That is, there is sufficient force to retain the cables without exerting a pressure that will damage the cables.

Accordingly, varying cooperating plate thicknesses and varying numbers of cables of differing thicknesses can be accomodated using a single size clamp. The convex surface 15 at the forward margin of the spring arm 13 effects a substantially line contact with a clamped cable extending transversely between the depending leg members 17 to cause the clamping force and the opposing retaining force to be directly opposed without a force couple induced by longitudinal offset.

While the invention has been particularly shown and described with reference to a preferred embodiment thereof, it will be understood by those skilled in the art that various changes in form and details may be made therein without departing from the spirit and scope of the invention.

We claim:

1. In combination with a plate member having upper and lower surfaces and a pair of spaced apertures therethrough, a cable clamp and strain relief device comprising a body portion;
 a pair of depending resilient leg members respectively disposed at and connected to opposite transverse margins of said body portion,
 said leg members each having a distal end portion turned back on itself to form an acute angle with the depending portion,
 said device being adapted for connection to said plate member by insertion of said depending leg member respectively through said pairs of apertures from the top surface causing said distal ends to be compressed toward said depending portion during transit through said aperture and restoring after transit through said aperture to engage the lower surface of said plate member to resist withdrawal;
 said leg member turned distal end portions terminating in a rectangular central tab and adjacent shoulder portions which extend perpendicularly from each transverse side of said tab, whereby if said distal end portion is inserted sufficiently the tab underlies the lower surface of the plate member and a shoulder may underlie said lower surface when it is not possible to extend said tab portion wholly beyond said lower surface; and
 a spring arm attached to said body portion along the margin thereof at one longitudinal end, formed of the material of said body portion and turned back to underlie said body portion between said leg members and compressively retain a cable disposed between said body portion and said plate member.

2. The combination of claim 1 wherein said cable clamp and strain relief device is formed of a single piece of resilient sheet material.

3. The combination of claim 2 wherein said cable clamp and strain relief device has at the distal end of said spring arm a transversely extending convex surface facing away from said body portion and adapted to maintain contact with a cable retained between said spring arm and said plate member upper surface along a line extending between said depending resilient leg members and said depending portions of said leg members present shoulder surfaces that limit the depth of insertion of said leg members into said apertures.

* * * * *